(12) United States Patent
Kato et al.

(10) Patent No.: US 10,020,315 B1
(45) Date of Patent: Jul. 10, 2018

(54) SEMICONDUCTOR MEMORY DEVICE

(71) Applicant: Toshiba Memory Corporation, Minato-ku (JP)

(72) Inventors: Tatsuya Kato, Yokkaichi (JP); Atsushi Murakoshi, Yokkaichi (JP); Fumitaka Arai, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/705,514

(22) Filed: Sep. 15, 2017

(30) Foreign Application Priority Data

Mar. 23, 2017 (JP) .................. 2017-058210

(51) Int. Cl.
*H01L 29/76* (2006.01)
*H01L 27/11521* (2017.01)
*H01L 27/11556* (2017.01)

(52) U.S. Cl.
CPC .. *H01L 27/11521* (2013.01); *H01L 27/11556* (2013.01)

(58) Field of Classification Search
CPC ..................... H01L 27/11521; H01L 27/11556
USPC ........................................................ 257/314
See application file for complete search history.

(56) References Cited

U.S. PATENT DOCUMENTS

| 8,753,973 | B2 | 6/2014 | Ikuma et al. |
| 9,093,642 | B2 * | 7/2015 | Okajima .................. G11C 7/06 |
| | | | 365/196 |
| 9,646,659 | B2 * | 5/2017 | Kim .......................... G11C 7/06 |
| | | | 365/196 |
| 2015/0069377 | A1 | 3/2015 | Rabkin et al. |
| 2015/0200199 | A1 | 7/2015 | Sakamoto et al. |
| 2015/0270282 | A1 | 9/2015 | Koshiishi et al. |
| 2016/0064345 | A1 | 3/2016 | Shimoda et al. |
| 2016/0336336 | A1 | 11/2016 | Nagashima et al. |

FOREIGN PATENT DOCUMENTS

| JP | 2013-62380 | 4/2013 |
| JP | 2017-10951 | 1/2017 |
| TW | 201537690 A | 10/2015 |
| TW | 201640654 A | 11/2016 |

* cited by examiner

*Primary Examiner* — Theresa T Doan
(74) *Attorney, Agent, or Firm* — Oblon, McClelland, Maier & Neustadt, L.L.P.

(57) ABSTRACT

A semiconductor memory device includes a first electrode film and a second electrode film spreading along a first direction and a second direction, first insulating plates intermittently disposed along the first direction and each of two columns separated in the second direction from each other, second insulating plates provided between the two columns, intermittently disposed along the first direction and each of n columns, third insulating plates provided between one of the two columns and a column formed of the second insulating plates, intermittently disposed along the first direction, a first insulating member provided between the first insulating plate and the third insulating plate, and a second insulating member provided between the second insulating plate and the third insulating plate. The first electrode film is divided into two parts between the two columns. The second electrode film is divided into {(n+1)× 2} parts between the two columns.

10 Claims, 10 Drawing Sheets

SEMICONDUCTOR MEMORY DEVICE

CROSS-REFERENCE TO RELATED APPLICATIONS

This application is based upon and claims the benefit of priority from Japanese Patent Application No. 2017-058210, filed on Mar. 23, 2017; the entire contents of which are incorporated herein by reference.

FIELD

Embodiments relate to a semiconductor memory device.

BACKGROUND

In the past, in the semiconductor memory devices, circuits have been miniaturized to thereby achieve an increase in capacity. However, since the miniaturization technology is approaching the limit, there has been proposed a stacked-type semiconductor memory device in order to achieve a further increase in capacity. In the stacked-type semiconductor memory device, a plurality of interconnections extending in a horizontal direction and a plurality of semiconductor members extending in a vertical direction are provided on a substrate, and between the interconnections and the semiconductor members, there are provided charge storage members. Thus, a memory cell transistor is formed in each of the cross parts between the interconnections and the semiconductor members. In such a semiconductor memory device, higher integration is requested.

DETAILED DESCRIPTION

Figure 1:
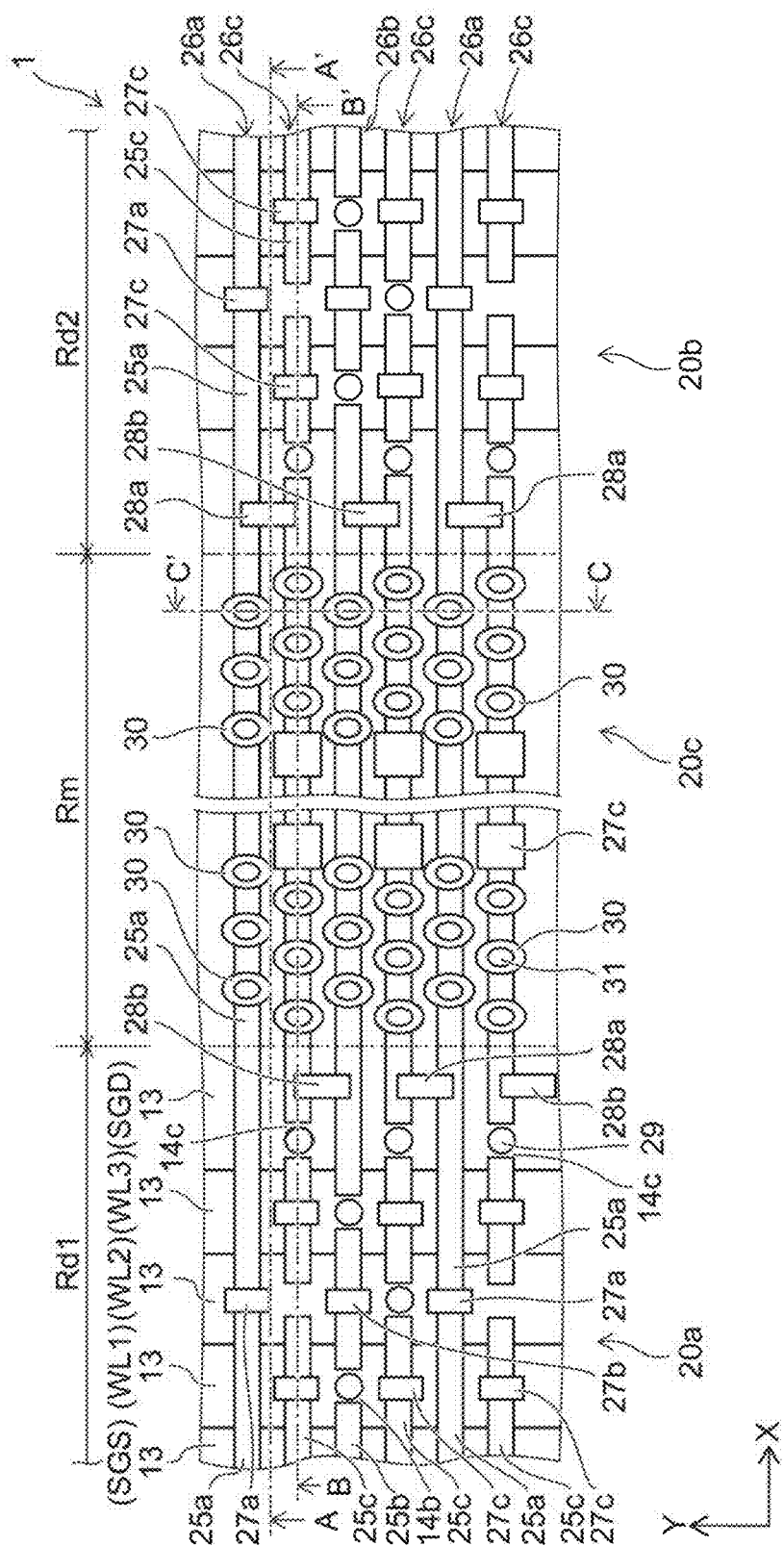
FIG. 1 is a top view showing a semiconductor memory device according to an embodiment.

A semiconductor memory device according to one embodiment, includes a first electrode film, a second electrode film, first insulating plates, second insulating plates, third insulating plates, a first insulating member, a second insulating member, a semiconductor member, and a charge storage member. The first electrode film spreads along a first direction and a second direction crossing the first direction. The second electrode film is provided on a third direction side with respect to a part except a first end part and a second end part in the first electrode film. The third direction crosses a plane including the first direction and the second direction. The first end part and the second end part are located on both sides in the first electrode film in the first direction. The first insulating plates are intermittently disposed along the first direction and each of two columns separated in the second direction from each other. The first insulating plates penetrate the first electrode film and the second electrode film in the third direction. The second insulating plates are provided between the two columns, intermittently disposed along the first direction and each of n columns (n is an integer not less than 1) separated in the second direction from each other. The second insulating plates penetrate the first electrode film and the second electrode film in the third direction. The third insulating plates are provided between one of the two columns and a column formed of the second insulating plates, intermittently disposed along the first direction. The third insulating plates penetrate the first electrode film and the second electrode film in the third direction. The first insulating member is provided between one of the first insulating plates and one of the third insulating plates. The first insulating member is in contact with the one of the first insulating plates and the one of the third insulating plates. The first insulating member penetrates the first electrode film and the second electrode film in the third direction. The second insulating member is provided between the one of the second insulating plates and one of the third insulating plates. The second insulating member is in contact with the one of the second insulating plates and the one of the third insulating plates. The second insulating member penetrates the first electrode film and the second electrode film in the third direction. The semiconductor member extends in the third direction. The charge storage member is provided between a part except the first end part and the second end part in the first electrode film and the semiconductor member. The first electrode film is divided into two parts isolated from each other by the second insulating plates, the third insulating plates, the first insulating member and the second insulating member between the two columns. The second electrode film is divided into $\{(n+1)\times 2\}$ parts isolated from each other by the second insulating plates, the third insulating plates, the first insulating member and the second insulating member between the two columns.

Hereinafter, the embodiment of the invention will be described.

FIG. 1 is a top view showing a semiconductor memory device according to the embodiment.

Figure 2:
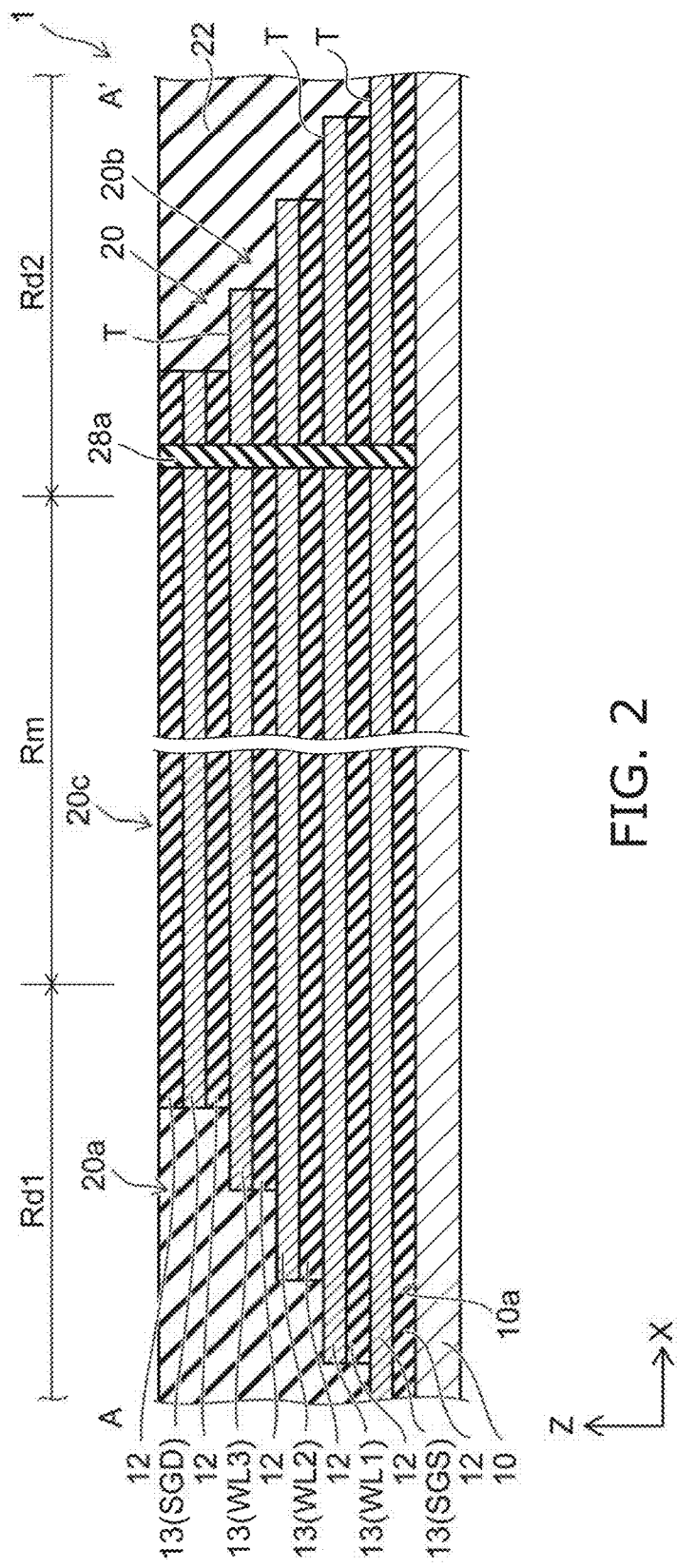
FIG. 2 is a cross-sectional view along the line A-A' shown in FIG. 1.

FIG. 2 is a cross-sectional view along the line A-A' shown in FIG. 1.

Figure 3:
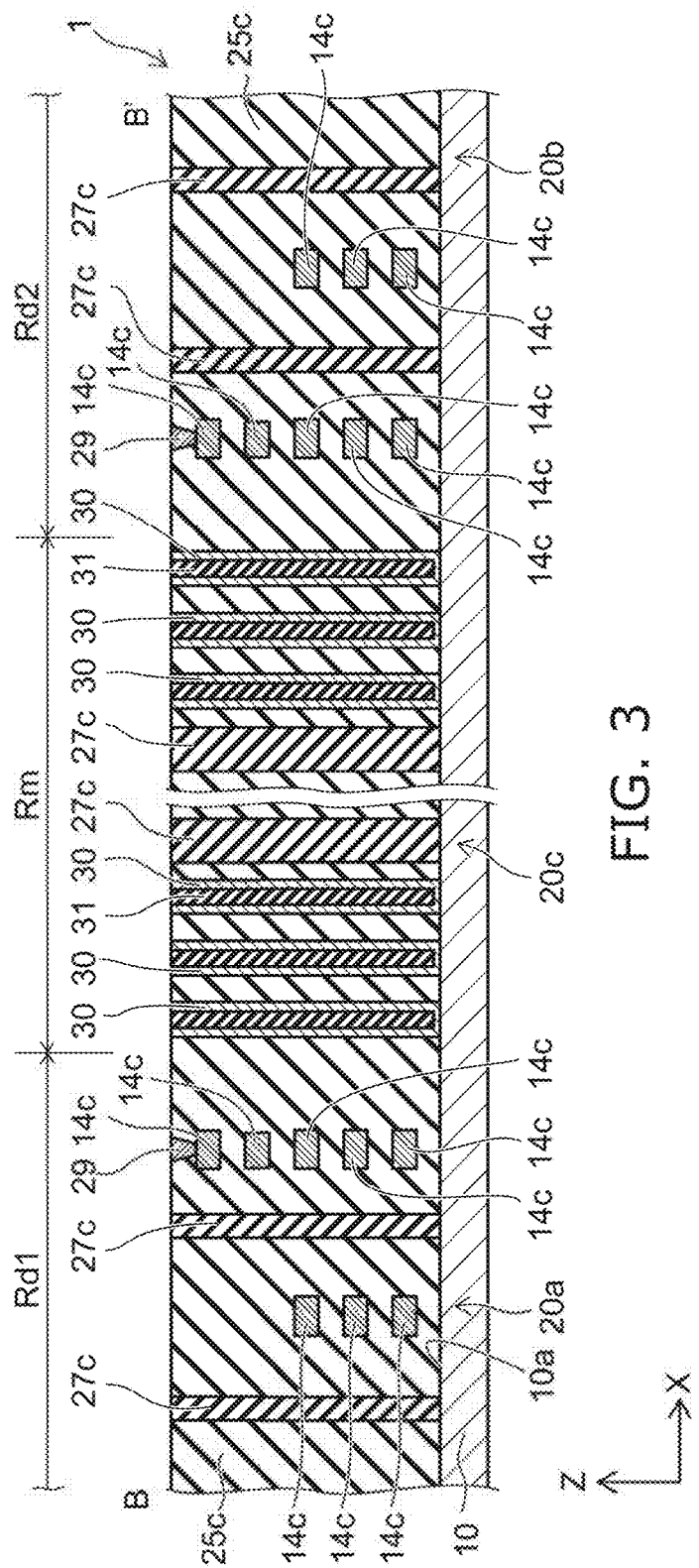
FIG. 3 is a cross-sectional view along the line B-B' shown in FIG. 1.

FIG. 3 is a cross-sectional view along the line B-B' shown in FIG. 1.

Figure 4:
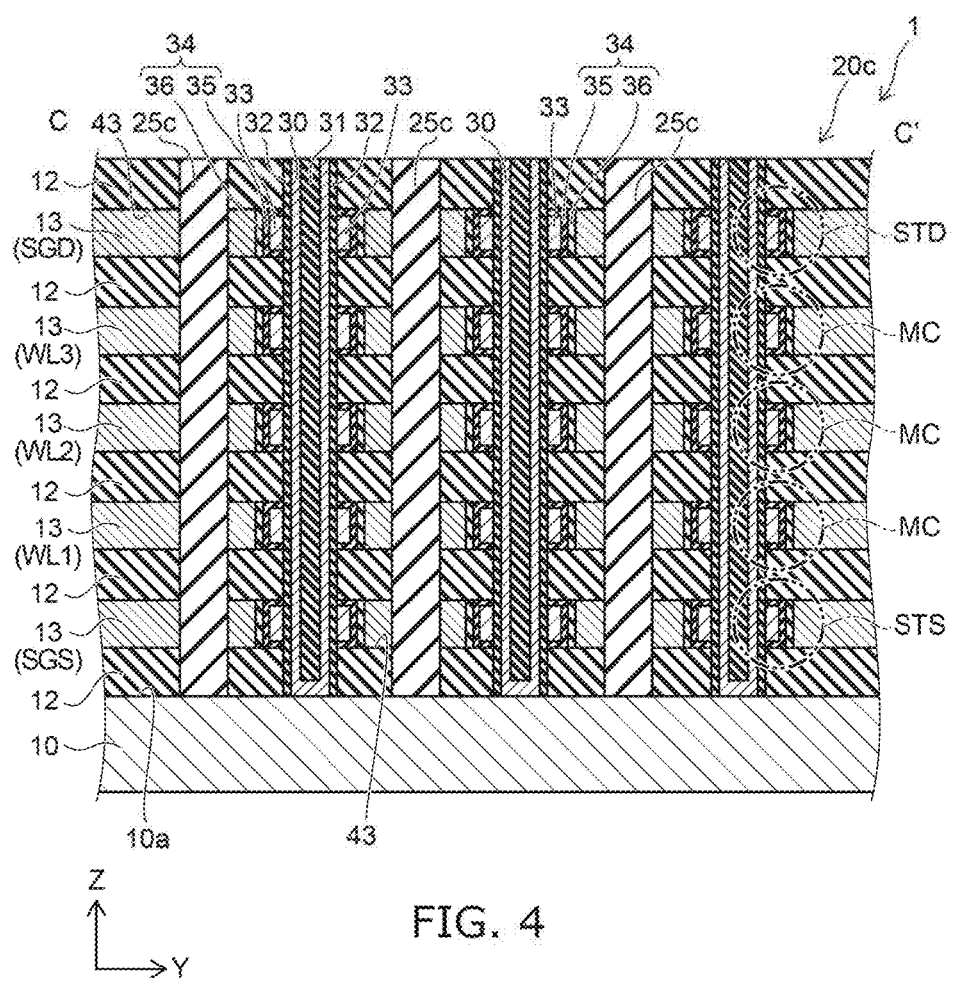
FIG. 4 is a cross-sectional view along the line C-C' shown in FIG. 1.

FIG. 4 is a cross-sectional view along the line C-C' shown in FIG. 1.

Figure 5:
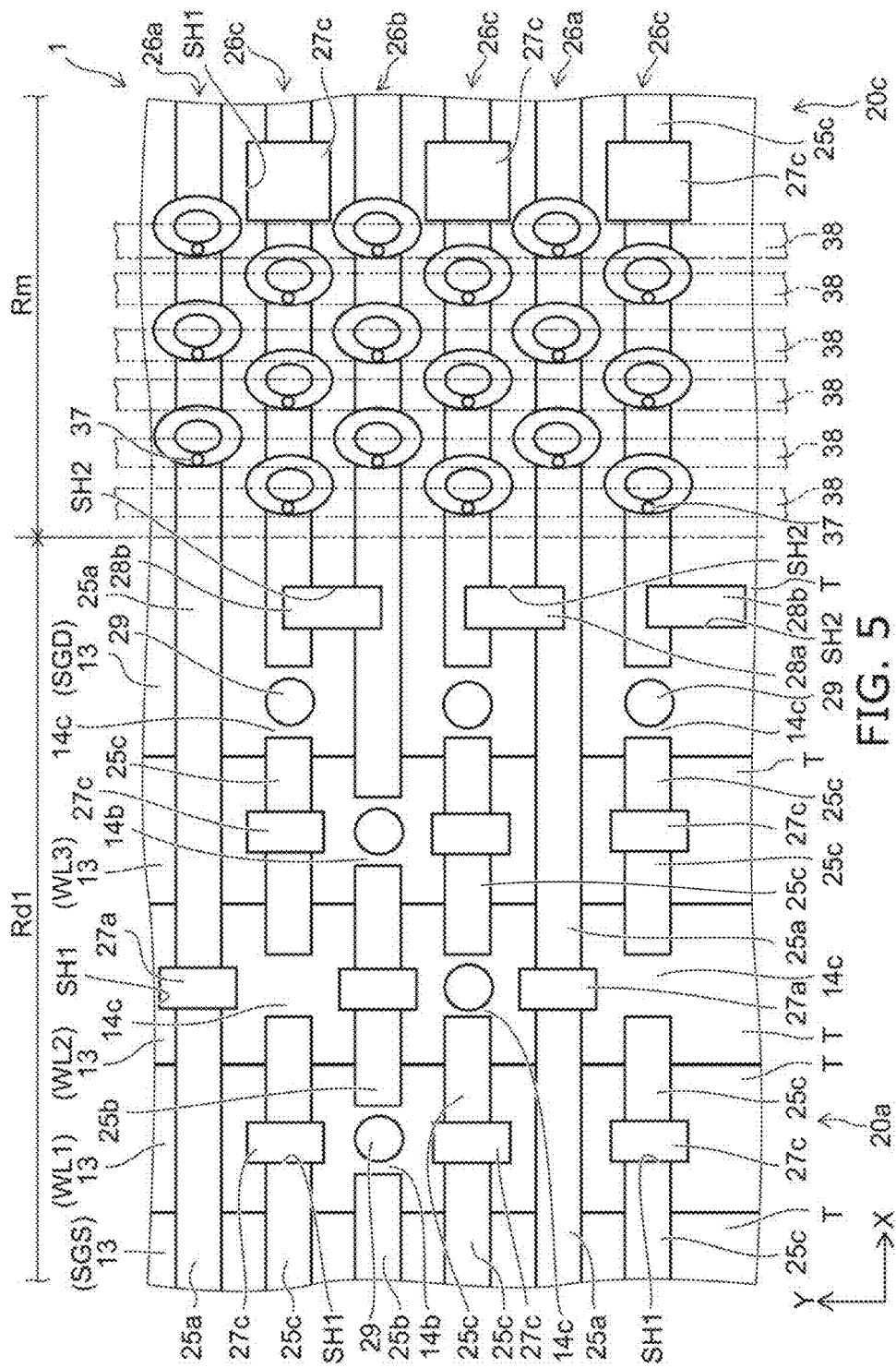
FIG. 5 is a partial enlarged view of FIG. 1.

FIG. 5 is a partial enlarged view of FIG. 1.

Figure 6:
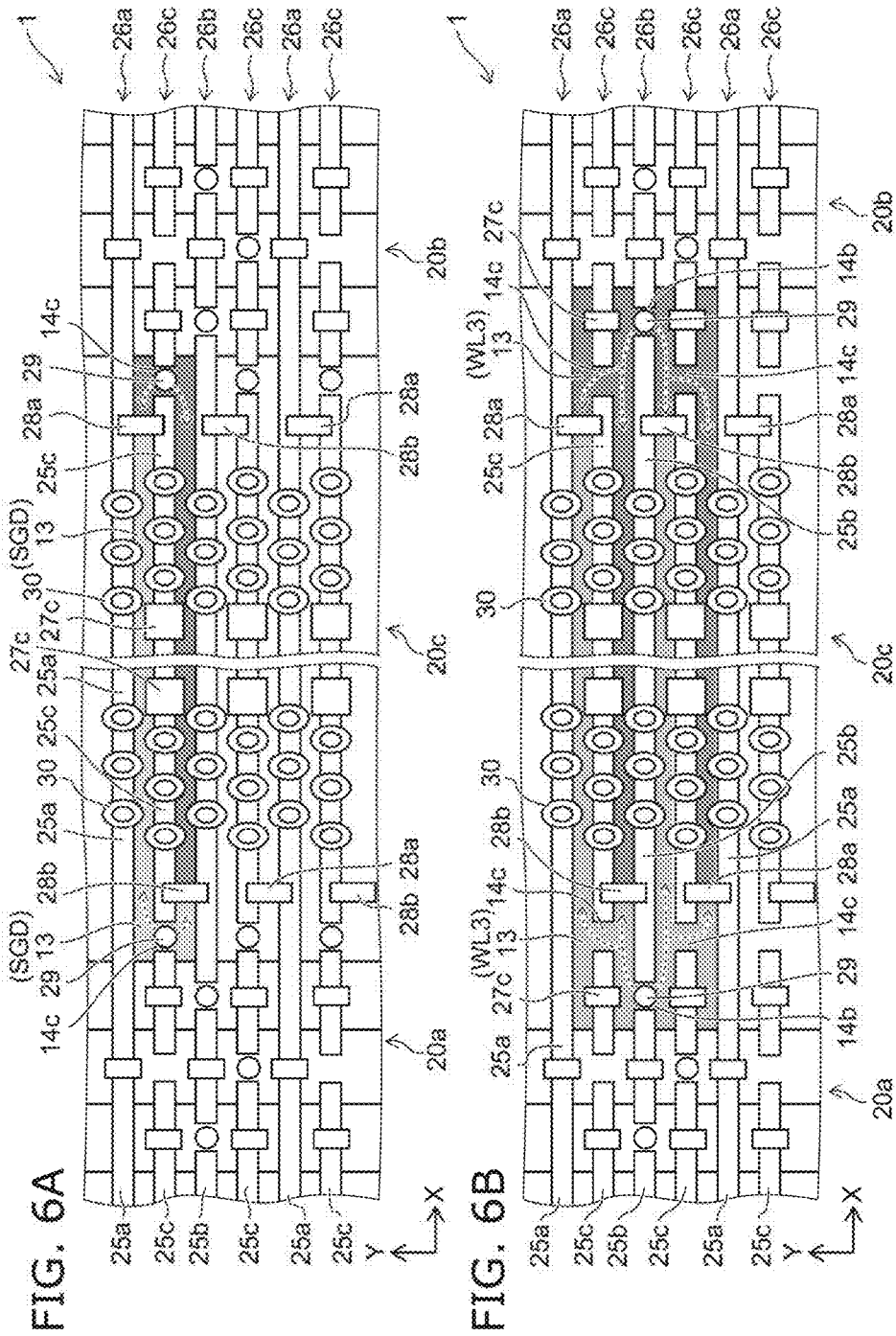
FIG. 6A is a diagram showing a connection relation of drain side selection gate lines in the semiconductor memory device according to the embodiment.
FIG. 6B is a diagram showing a connection relation of word lines.

FIG. 6A is a diagram showing a connection relation of drain side selection gate lines in the semiconductor memory device according to the embodiment, and FIG. 6B is a diagram showing a connection relation of word lines.

It should be noted that the drawings are schematic ones, and are drawn with arbitrary exaggerations and omissions. For example, the constituents are drawn smaller in number and larger in size than in reality. Further, the dimensional ratios of the constituents do not necessarily coincide between the drawings.

The semiconductor memory device according to the embodiment is a stacked-type NAND flash memory.

As shown in FIG. 1 to FIG. 5, in the semiconductor memory device 1 (hereinafter also referred to simply as a "device 1") according to the embodiment, there is provided a silicon substrate 10. The silicon substrate 10 is formed of, for example, a silicon single crystal. On the silicon substrate 10, there is provided a stacked body 20.

Hereinafter, in the specification, for the sake of convenience of explanation, there is adopted an XYZ Cartesian coordinate system. Two directions parallel to an upper surface 10a of the silicon substrate 10, and perpendicular to each other are defined as an "X-direction" and a "Y-direction," and a direction perpendicular to the upper surface 10a of the silicon substrate 10 is defined as a "Z-direction." Further, a direction from the silicon substrate 10 toward the stacked body 20 and parallel to the Z-direction is also referred to as an "upward direction," and the reverse direction is also referred to as a "downward direction." However, these expressions are also for the sake of convenience, and have no relation with the gravitational direction.

In the stacked body 20, a plurality of insulating films 12 and a plurality of electrode films 13 are alternately stacked along the Z-direction. The insulating films 12 are each formed of an insulating material such as silicon oxide (SiO). The electrode films 13 are each formed of a conductive material such as tungsten (W). The insulating films 12 and the electrode films 13 each spread along the X-Y plane. As described later, each of the electrode films 13 is divided by a plurality of insulating plates and a plurality of insulating members into a plurality of parts. However, the plurality of parts disposed in the same X-Y plane are collectively referred to as the "electrode film 13."

Out of the electrode films 13 provided in the stacked body 20, one or a plurality of electrode films 13 from the lowermost layer functions as a source-side selection gate line SGS. Further, one or a plurality of electrode films 13 from the uppermost layer functions as a drain-side selection gate line SGD. The electrode films 13 other than the source-side selection gate line SGS and the drain-side selection gate line SGD each function as a word line WL. In the embodiment, in order to simplify the description, it is assumed that the 5 layers of electrode films 13 are provided, there are provided 1 layer of source-side selection gate line SGS, 1 layer of drain-side selection gate line SGD, and 3 layers of word lines WL, wherein the word lines WL are defined as word lines WL1, WL2, WL3 in sequence from the lower layer side. It should be noted that in the actual product, it is possible to provide several tens of layers of electrode films 13, and several layers of source-side selection gate lines SGS and several layers of drain-side selection gate lines SGD can also be provided. Further, it is also possible to arbitrarily provide dummy electrode films 13 which do not electrically function.

As shown in FIG. 1 to FIG. 3, the end parts 20a and 20b on the both sides in the X-direction in the stacked body 20 are used respectively as an extraction region Rd1 and an extraction region Rd2. Further, a central part 20c except the end parts 20a and 20b on the both sides in the X-direction in the stacked body 20, namely the region between the extraction region Rd1 and the extraction region Rd2, is used as a memory cell region Rm. In the extraction regions Rd1 and Rd2, the shape of the stacked body 20 is a stepped shape, and a terrace T is provided to each of the electrode films 13. Further, on the silicon substrate 10, there is provided an interlayer insulating film 22, which covers the end part of the stacked body 20. The interlayer insulating film 22 is formed of an insulating material such as silicon oxide.

In the stacked body 20 and the interlayer insulating film 22, there are provided insulating plates 25a though 25c spreading along the X-Z plane. Hereinafter, an aggregate of a plurality of insulating plates 25a arranged in a line along the X-direction is referred to as a "column 26a." Similarly, an aggregate of a plurality of insulating plates 25b arranged in a line along the X-direction is referred to as a "column 26b," and an aggregate of a plurality of insulating plates 25c arranged in a line along the X-direction is referred to as a "column 26c." In other words, the insulating plates 25a through 25c are separated in the Y-direction from each other, and disposed along the plurality of columns 26a through 26c each extending in the X-direction, and are intermittently disposed along the X-direction in each of the columns 26a through 26c. The insulating plates 25a through 25c each penetrate the stacked body 20 and the interlayer insulating film 22 in the Z-direction. Thus, the insulating plates 25a through 25c each penetrate each of the electrode films 13 in the Z-direction to thereby divide each of the electrode films 13.

In the specification, the description "dividing the electrode film 13" means that the electrode film 13 is divided into two parts separated from each other and isolated from each other at least in that region. It should be noted that the two parts thus divided can be connected to each other in other regions.

In FIG. 1, the columns 26a are shown as two columns. The two columns 26a are arranged in the Y-direction. Between the two columns 26a, there is provided one column 26b. Further, between each of the columns 26a and the column 26b, there is provided one column 26c. Therefore, the two columns 26a adjacent in the Y-direction to each other, and the columns disposed in between are the column 26a, the column 26c, the column 26b, the column 26c, and the column 26a arranged in this order along the Y-direction.

Further, in the stacked body 20 and the interlayer insulating film 22, there are provided a plurality of insulating members 27a, a plurality of insulating members 27b, and a plurality of insulating members 27c. Each of the insulating members 27a through 27c has a quadrangular prism shape or an elliptic cylindrical shape extending in the Z-direction, and penetrates the stacked body 20 and the interlayer insulating film 22 in the Z-direction. Thus, the insulating members 27a through 27c each penetrate the electrode films 13 in the Z-direction to thereby divide the electrode films 13. The insulating members 27a through 27c are different in position in the Y-direction from each other.

The insulating members 27a are disposed in the column 26a and are each disposed between the insulating plates 25a adjacent in the X-direction to each other to have contact with these insulating plates 25a. The length in the Y-direction of the insulating members 27a is longer than the length in the Y-direction of the insulating plates 25a. In the extraction regions Rd1 and Rd2, the insulating member 27a is disposed in every gap between the insulating plates 25a adjacent in the X-direction to each other. Thus, in the extraction regions Rd1 and Rd2, the insulating plates 25a and the insulating members 27a disposed in the column 26a are seamlessly connected to each other to form an insulating body continuously extending in the X-direction, and thus divide the electrode films 13 in the Y-direction. In other words, the two parts disposed at positions across the column 26a from each other in the electrode films 13 are isolated from each other.

The insulating members 27b are disposed in the column 26b and are each disposed between the insulating plates 25b adjacent in the X-direction to each other to have contact with these insulating plates 25b. The length in the Y-direction of the insulating members 27b is longer than the length in the Y-direction of the insulating plates 25b. In the extraction regions Rd1 and Rd2, the insulating members 27b are disposed in some of the gaps between the insulating plates 25b adjacent in the X-direction to each other, and are not disposed in some of such gaps. The gaps where the insulating members 27b are not disposed are disposed in some of the steps except the uppermost step in the end part having the stepped shape of the stacked body 20. Therefore, the drain-side selection gate line SGD located in the uppermost layer of the stacked body 20 is divided by the column 26b in the Y-direction. In contrast, in some of the electrode films 13 except the drain-side selection gate line SGD, there are disposed gaps, which are located between the insulating plates 25b adjacent in the X-direction to each other, and in which the insulating member 27b is not disposed, and a bridge part 14b is formed in each of such gaps. The bridge part 14b connects the two parts, which are separated by the insulating plate 25b in the electrode films 13, to each other.

The insulating members 27c are disposed in the column 26c and are each disposed between the insulating plates 25c adjacent in the X-direction to each other to have contact with these insulating plates 25c. The length in the Y-direction of the insulating members 27c is longer than the length in the Y-direction of the insulating plates 25c. In the extraction regions Rd1 and Rd2, the insulating members 27c are disposed in some of the gaps between the insulating plates 25c adjacent in the X-direction to each other, and are not disposed in some of such gaps. The gaps where the insulating members 27c are not disposed are disposed in the uppermost step in the end part having the stepped shape of the stacked body 20 with no exception, and are disposed in some of the steps except the uppermost step. Therefore, in the drain-side selection gate line SGD, there are disposed gaps, which are located between the insulating plates 25c adjacent in the X-direction to each other, and in which the insulating member 27c is not disposed, and a bridge part 14c is formed in each of such gaps. Further, the bridge part 14c is also formed in some of the electrode films 13 except the drain-side selection gate line SGD. The bridge part 14c connects the two parts, which are separated by the insulating plate 25c in the electrode films 13, to each other.

Further, in the stacked body 20 and the interlayer insulating film 22, there are provided a plurality of insulating members 28a, and a plurality of insulating members 28b. Each of the insulating members 28a and 28b has a quadrangular prism shape or an elliptic cylindrical shape extending in the Z-direction, and penetrates the stacked body 20 and the interlayer insulating film 22 in the Z-direction between the columns 26 adjacent to each other. When viewed from the Z-direction, the insulating members 28a and 28b are disposed in the uppermost step of the end part having the stepped shape in the stacked body 20. Therefore, the insulating members 28a and 28b penetrate all of the electrode films 13 including the drain-side selection gate line SGD. In the extraction region Rd2, the insulating members 28a and 28b are not disposed between the columns 26 between which the insulating member 28a or 28b is disposed in the extraction region Rd1, and the insulating members 28a and 28b are alternately disposed in the extraction region Rd1 and the extraction region Rd2 between the columns 26 arranged along the Y-direction. In each of the extraction regions Rd1 and Rd2, the insulating members 28a and the insulating members 28b are alternately arranged in the Y-direction.

The insulating members 28a are each disposed between the insulating plate 25a and the insulating plate 25c adjacent in the Y-direction to each other to have contact with the insulating plate 25a and the insulating plate 25c. Thus, the insulating members 28a each divide the electrode films 13 in the X-direction. There are provided two insulating members 28a between the two insulating plates 25a adjacent in the Y-direction to each other, and the two insulating members 28a are respectively disposed in the extraction region Rd1 and the extraction region Rd2.

The insulating members 28b are each disposed between the insulating plate 25b and the insulating plate 25c adjacent in the Y-direction to each other to have contact with the insulating plate 25b and the insulating plate 25c. Thus, the insulating members 28b each divide the electrode films 13 in the X-direction. There are provided two insulating members 28b between the two insulating plates 25a adjacent in the Y-direction to each other, and the two insulating members 28b are respectively disposed in the extraction region Rd1 and the extraction region Rd2.

Due to the insulating plates 25a through 25c, the insulating members 27a through 27c, and the insulating members 28a and 28b disposed in such a manner, the electrode films 13 are connected to each other in the following manner in the extraction regions Rd1 and Rd2. In FIG. 6A, the two parts isolated from the periphery in the drain-side selection gate line SGD are shown with hatching. Similarly, in FIG. 6B, the two parts isolated from the periphery in the word line WL3 are shown with hatching.

As shown in FIG. 6A, the electrode film 13 in the uppermost layer, namely the drain-side selection data line SGD, is segmentalized by the column 26a in the Y-direction. Further, the drain-side election gate line SGD is also segmentalized by the column 26b in the Y-direction. In contrast, the drain-side selection gate line SGD is not completely segmentalized by the column 26c, but the two parts of the drain-side selection gate line SGD disposed on the both sides in the Y-direction of the column 26c are connected to each other via the bridge part 14c. Therefore, the part sandwiched by the column 26a and the column 26b in the drain-side selection gate line SGD is isolated from the periphery.

Further, one of two interconnection-like parts sandwiching the insulating plate 25c in the drain-side selection gate line SGD is segmentalized by the insulating member 28a in the X-direction in the extraction region Rd2, and the other is segmentalized by the insulating member 28b in the X-direction in the extraction region Rd1. As a result, the drain-side selection gate line SGD is divided into J-shaped parts each including the two interconnection-like parts and the one bridge part 14c. The pair of J-shaped parts are disposed in a nested manner as a set in the region sandwiched by the column 26a and the column 26b.

As shown in FIG. 6B, the electrode film 13 in the second uppermost layer, namely the word line WL3 as the uppermost layer, is segmentalized by the column 26a in the Y-direction. In contrast, the word line WL3 is not completely segmentalized by the column 26b, and the two parts disposed on the both sides in the Y-direction of the column 26b in the word line WL3 are connected to each other via the bridge part 14b. Similarly, the word line WL3 is also not completely segmentalized by the column 26c, and the two parts disposed on the both sides in the Y-direction of the column 26c in the word line WL3 are connected to each other via the bridge part 14c. Thus, the four interconnection-like parts extending in the X-direction are connected to each other via the bridge parts 14b and 14c between the two columns 26a adjacent in the Y-direction to each other.

Further, two of the four interconnection-like parts in the word line WL3 are segmentalized by the insulating members 28a and 28b in the X-direction in the extraction region Rd1, and the other two are segmentalized by the insulating members 28a and 28b in the X-direction in the extraction region Rd2.

As a result, the word line WL3 is divided into comb-shaped parts each including the four interconnection-like parts. The pair of comb-shaped parts are disposed in a nested manner as a set in the region sandwiched by the two columns 26a. The connections of the word line WL2, the word line WL1, and the source-side selection gate line SGS are substantially the same as the connection of the word line WL3.

Further, in the interlayer insulating film 22, there are provided contacts 29 each extending in the Z-direction. The lower ends of some of the contacts 29 are connected to the bridge parts 14c of the drain-side selection gate line SGD. The lower ends of other of the contacts 29 are connected to the bridge parts 14b of the word line WL3. The lower ends of still other of the contacts 29 are connected to the bridge parts 14c of the word line WL2. The lower ends of still other of the contacts 29 are connected to the bridge parts 14b of the word line WL1. The lower ends of still other of the contacts 29 (not shown) are connected to the bridge parts 14c of the source-side selection gate line SGS. In such a manner as described above, each part of the electrode films 13 isolated from the periphery is connected to either of the contacts 29 via the bridge part 14b or 14c.

Then, a configuration of the memory cell region Rm will be described.

In the memory cell region Rm, there is provided a plurality of silicon pillars 30 as semiconductor members. Each of the silicon pillars 30 is disposed between the insulating plates 25 adjacent in the X-direction to each other. Further, when viewed from the Z-direction, the silicon pillars 30 are arranged in a zigzag manner. Specifically, the silicon pillars 30 disposed in the column 26a and the column 26b are equal in position in the X-direction to each other, and the silicon pillars 30 disposed in the column 26c is shifted in position in the X-direction from the silicon pillars 30 disposed in the column 26a and the column 26b as much as a half of the arrangement period of the silicon pillars 30. The shape of each of the silicon pillars 30 is a cylindrical shape having the longitudinal direction parallel to the Z-direction with the lower end blocked. The lower ends of the silicon pillars 30 are connected to the silicon substrate 10.

In each of the silicon pillars 30, there is provided a core member 31 made of, for example, silicon oxide. On the side surface of each of the silicon pillars 30, there is provided a tunnel insulating film 32 made of, for example, silicon oxide. The tunnel insulating film 32 has contact with the insulating plate 25a, 25b or 25c disposed on the both sides in the X-direction. The tunnel insulating film 32 is a film, which has an insulating property in a normal state, and allows the tunnel current to flow when a predetermined voltage within a range of the drive voltage of the device 1 is applied. The shape of the tunnel insulating film 32 is a cylindrical shape having the longitudinal direction parallel to the Z-direction.

Between the tunnel insulating film 32 and each of the electrode films 13, there are provided floating gate electrodes 33. The floating gate electrodes 33 are disposed on the both sides in the Y-direction of the tunnel insulating film 32. The floating gate electrodes 33 are each formed of a conductive material such as polysilicon. The floating gate electrodes 33 are each a charge storage member capable of storing the charge.

Between the floating gate electrodes 33 and each of the electrode films 13, there are provided block insulating films 34. The block insulating films 34 are each a film substantially preventing a current from flowing even in the case in which a voltage is applied within a range of the drive voltage of the device 1. In each of the block insulating films 34, a silicon nitride film 35 and a silicon oxide film 36 are stacked on one another. It should be noted that in FIG. 1 through FIG. 4, and FIGS. 6A and 6B, illustration of the tunnel insulating films 32, the floating gate electrodes 33, and the block insulating films 34 is omitted.

As shown in FIG. 5, on the stacked body 20, there are provided bit lines 38 extending in the Y-direction. The bit lines 38 are each connected to the silicon pillars 30 via plugs 37. Thus, the silicon pillars 30 are each connected between the bit line 38 and the silicon substrate 10.

Further, in each of the cross parts between the silicon pillars 30 and the word lines WL, the memory cell transistor MC is formed via the tunnel insulating film 32, the floating gate electrode 33, and the block insulating film 34. In the memory transistor MC, the threshold value changes in accordance with the amount of charge stored in the floating gate electrode 33, and thus data is stored.

Further, in each of the cross parts between the silicon pillars 30 and the source-side selection gate line SGS, there is formed a source-side selection transistor STS. The source-side selection transistor STS switches between conduction and non-conduction of the silicon pillar 30 in accordance with the potential of the source-side selection gate line SGS. Further, in each of the cross parts between the silicon pillars 30 and the drain-side selection gate line SGD, there is formed a drain-side selection transistor STD. The drain-side selection transistor STD switches between conduction and non-conduction of the silicon pillar 30 in accordance with the potential of the drain-side selection gate line SGD.

In such a manner as described above, the memory cell transistors MC are connected in series between the silicon substrate 10 and the bit lines 38, and the source-side selection transistor STS and the drain-side selection transistor STD are connected to the both ends thereof to form a NAND string.

Then, a method of manufacturing the semiconductor memory device according to the embodiment will be described.

FIG. 7 to FIG. 10 are cross-sectional views showing the method of manufacturing the semiconductor memory device according to the embodiment.

Figure 7:
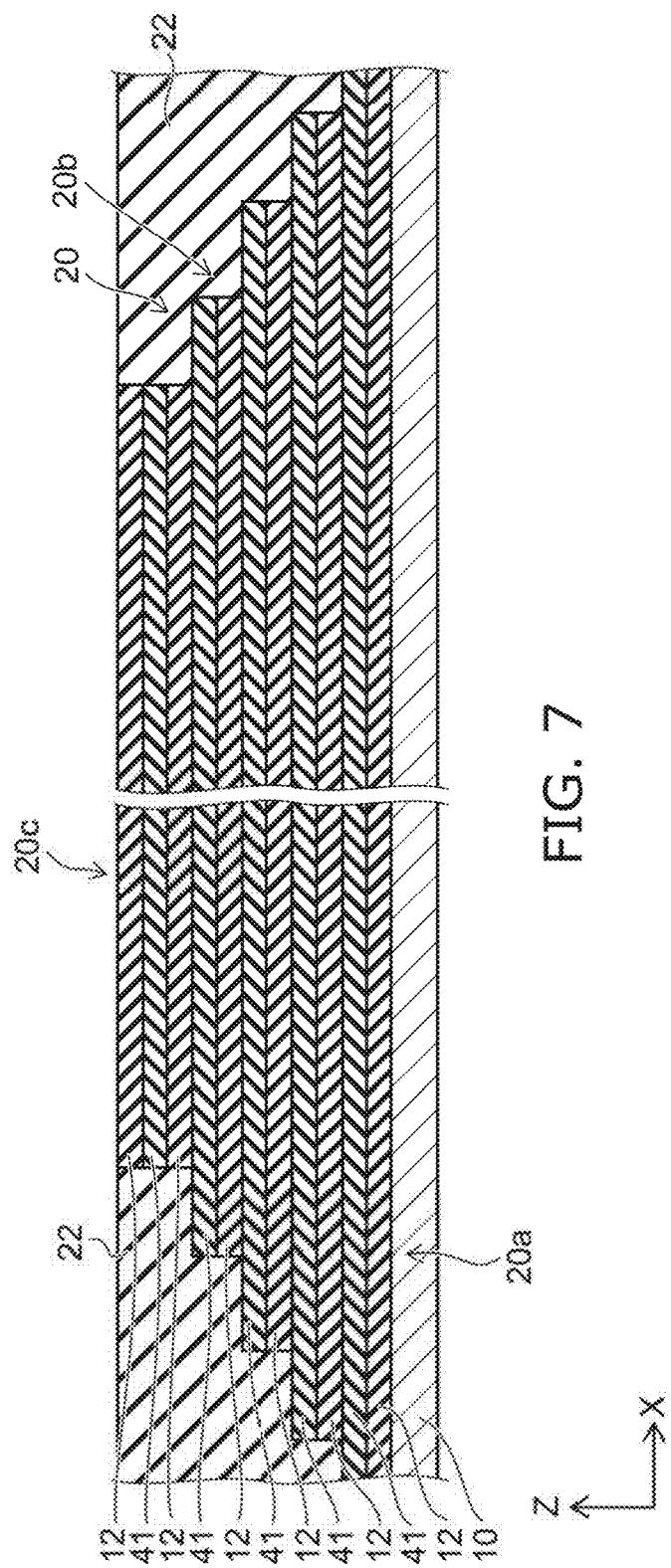
FIG. 7 to FIG. 10 are cross-sectional views showing a method of manufacturing the semiconductor memory device according to the embodiment.

Firstly, as shown in FIG. 7, the insulating films 12 and the sacrificial films 41 are alternately stacked on one another to form the stacked body 20 on the silicon substrate 10. As described above, the insulating films 12 are each formed of, for example, silicon oxide. The sacrificial films 41 are formed of a material capable of providing a sufficient etching selectivity with respect to the insulating films 12, and are formed of, for example, silicon nitride (SiN). Then, the end parts 20a and 20b on the both end sides in the X-direction of the stacked body 20 are each processed to have the stepped shape. Then, by depositing the silicon oxide on the entire surface, and then performing a planarization process such as CMP (Chemical Mechanical Polishing) on the upper surface, the interlayer insulating film 22 covering the end parts 20a and 20b of the stacked body 20 is formed.

Figure 8:
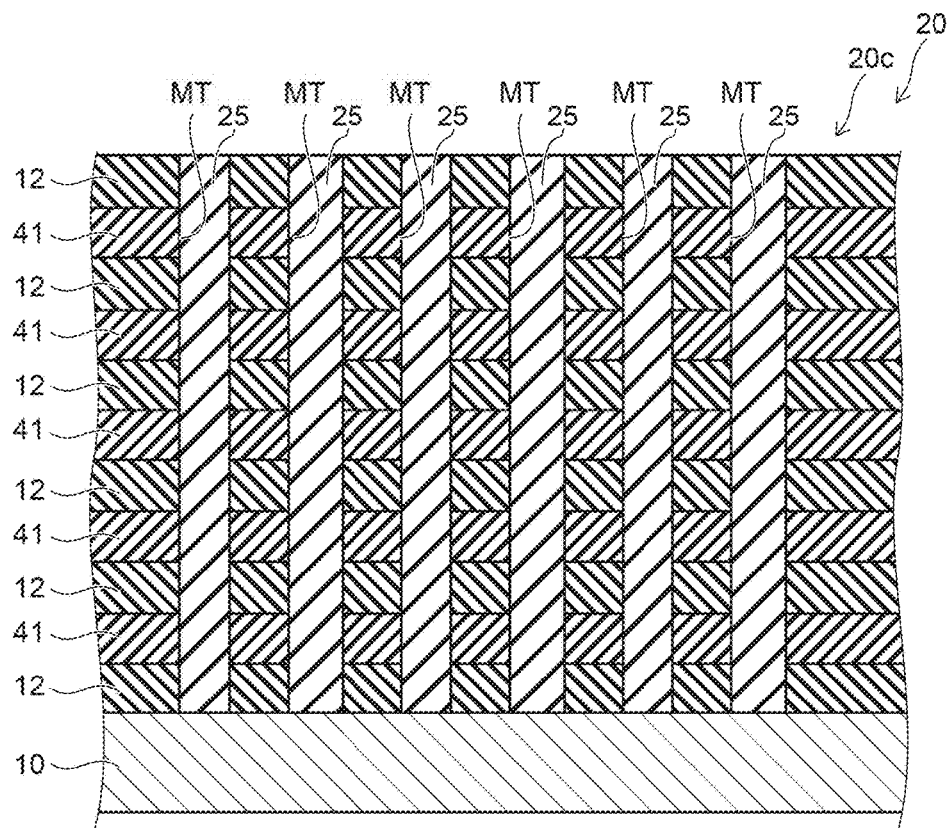

Then, as shown in FIG. 8, the memory trenches MT are formed in the stacked body 20 and the interlayer insulating film 22 (see FIG. 7). The memory trench MT is intermittently formed along the X-direction in each of the columns arranged along the Y-direction. Then, the memory trenches MT are filled with the silicon oxide to form the insulating plates 25.

Figure 9:
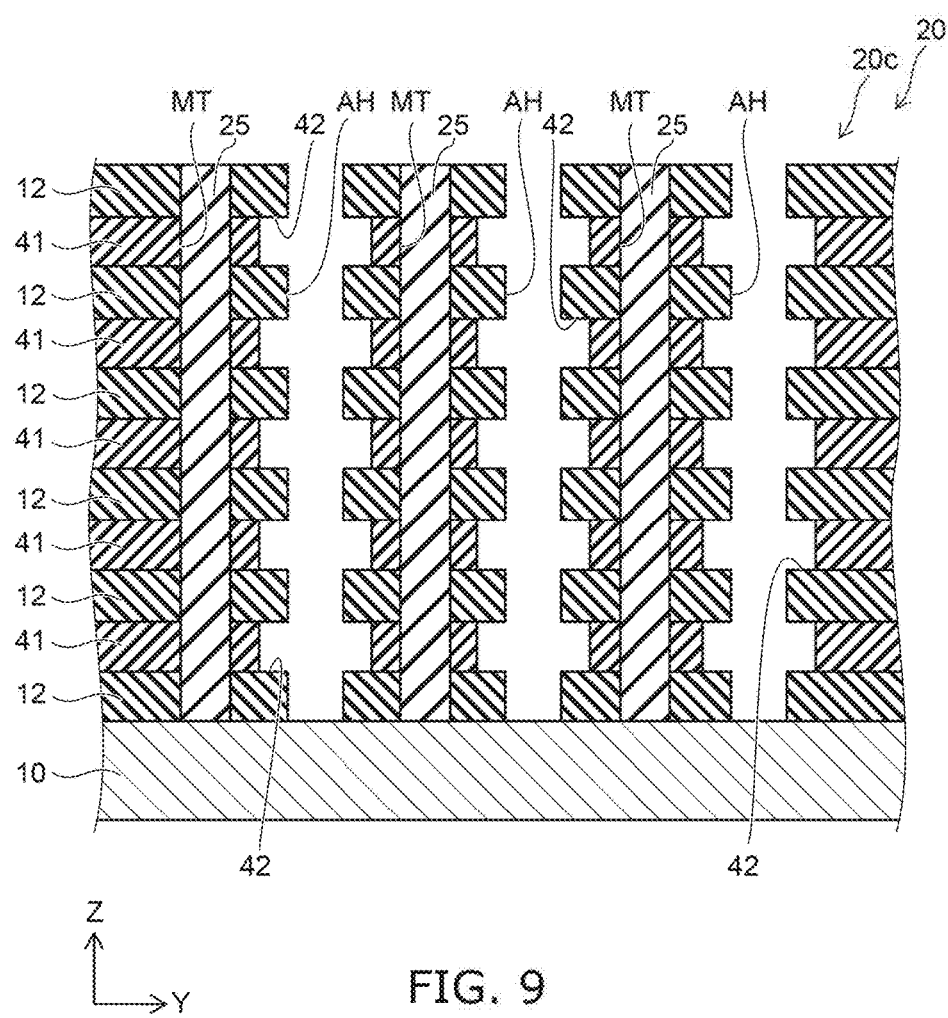

Then, as shown in FIG. 9, memory holes AH are formed so as to segmentalize the insulating plates 25. The memory holes AH are formed in the memory region Rm, and are arranged in a zigzag manner viewed from the Z-direction. The sacrificial films 41 are exposed on the side surfaces facing to the Y-direction of the memory holes AH. Then, by performing isotropic etching via the memory holes AH, the sacrificial films 41 are recessed in the internal surface of the memory holes AH. Thus, the exposed surfaces of the sacrificial films 41 recede, and the recesses 42 are formed in the side surface of each of the memory holes AH.

Figure 10:
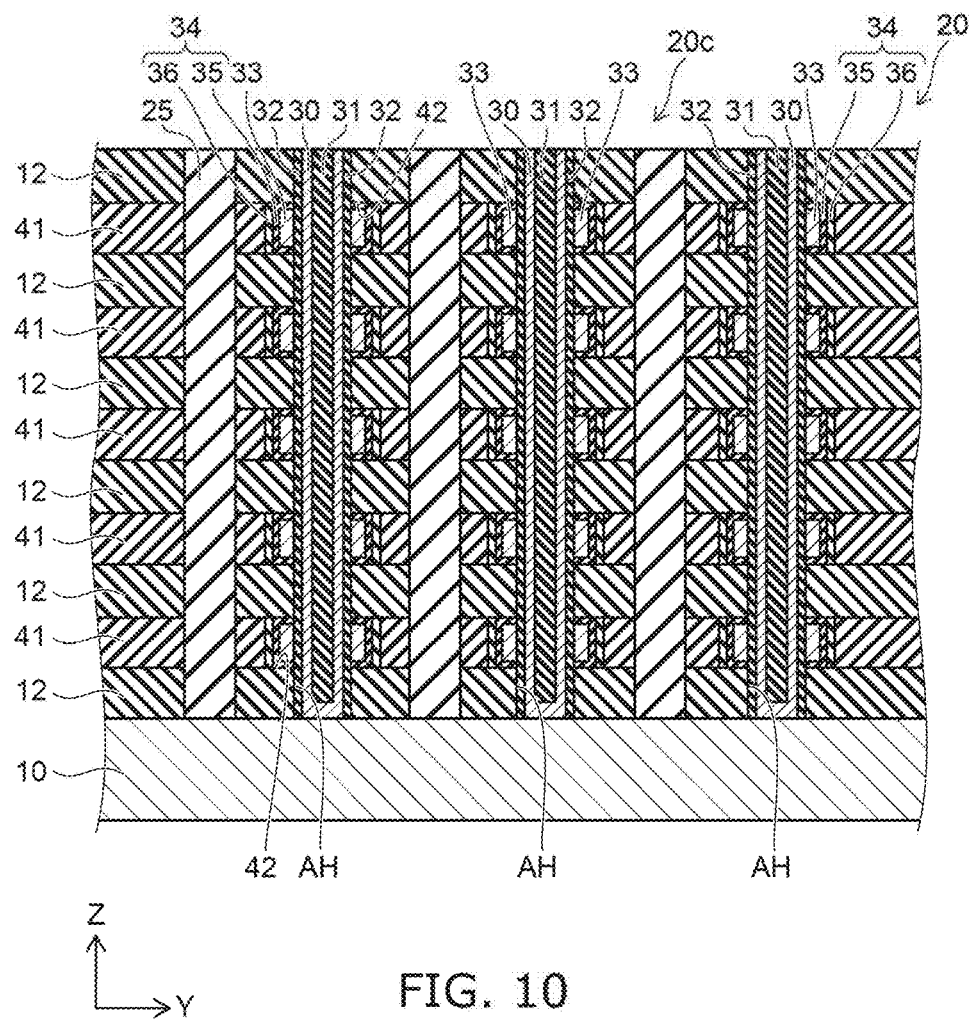

Then, as shown in FIG. 10, by performing a thermal oxidation treatment, a silicon oxide film 36 is formed on the exposed surface of each of the sacrificial films 41. It should be noted that it is also possible to form the silicon oxide film 36 by depositing the silicon oxide. Then, by depositing the silicon nitride, the silicon nitride films 35 are formed on the internal surfaces of the memory holes AH and the recesses 42. Then, by depositing silicon, the polysilicon films are formed on the internal surfaces of the memory holes AH and the recesses 42. Then, by performing etching via the memory holes AH, the polysilicon films and the silicon nitride films 35 are removed from the side surfaces of the memory holes AH. Thus, the silicon nitride films 35 remain on the internal surfaces of the recesses 42, and at the same time, the floating gate electrodes 33 made of polysilicon are formed in the recesses 42. Then, the tunnel insulating film 32, the silicon pillar 30 and the core member 31 are formed on the internal surface of each of the memory holes AH.

Then, as shown in FIG. 5, the holes SH1 are formed so as to segmentalize the insulating plates 25, and at the same time, the holes SH2 are formed so as to segmentalize the sacrificial films 41 and the insulating films 12. Then, by performing the isotropic etching via the holes SH1 and SH2, the sacrificial films 41 (see FIG. 10) are removed. Thus, as shown in FIG. 4, spaces 43 are formed in the areas where the sacrificial films 41 are removed. On this occasion, the insulating plates 25 are not removed. Further, since the silicon oxide films 36 function as the etch stopper, the block insulating films 34, the floating gate electrodes 33, the tunnel insulating films 32, the silicon pillars 30 and the core members 31 are not removed. Thus, the insulating plates 25, the silicon pillars 30 and so on support the stacked body 20.

Then, as shown in FIG. 1 to FIG. 5, the conductive material such as tungsten is deposited via the holes SH1 and SH2. Then, by performing etching, the conductive material is removed from the inside of the holes SH1 and the inside of the holes SH2. Thus, the electrode films 13 are formed in the space 43. On this occasion, the bridge parts 14*b* and 14*c* are formed in the regions where the insulating plates 25 are segmentalized in the X-direction, and the holes SH1 and SH2 are not formed. Then, by depositing the silicon oxide on the entire surface, the insulating members 27*a* through 27*c* are formed in the holes SH1, and at the same time, the insulating members 28*a* and 28*b* are formed in the holes SH2.

Then, in the interlayer insulating film 22, there are formed the contacts 29 each extending in the Z-direction. The lower ends of the contacts 29 are each connected to the bridge part 14*b* or the bridge part 14*c* of the electrode films 13. It should be noted that it is also possible for the both end parts in the X-direction of the contact 29 to run off the bridge parts 14*b* or 14*c* and enter the insulating plate 25. Then, the plugs 37 are formed on the stacked body 20 to be connected to the silicon pillars 30. Then, the bit lines 38 each extending in the Y-direction are formed on the plugs 37, and are connected to the respective plugs 37. In such a manner as described above, the semiconductor memory device 1 according to the embodiment is manufactured.

Then, the advantages of the embodiment will be described.

According to the embodiment, as shown in FIGS. 6A and 6B, the insulating plates 25*a* and the insulating members 27*a* constituting the column 26*a* divide the drain-side selection gate line SGD, the word lines WL, and the source-side selection gate line SGS along the Y-direction to thereby divide the stacked body 20 into a plurality of blocks. Further, the insulating plates 25*b* and the insulating members 27*b* constituting the column 26*b* further divide the drain-side selection gate line SGD along the Y-direction. On the other hand, the column 26*b* does not completely divide the word lines WL and the source-side selection gate line SGS. Further, the insulating members 28*a* and 28*b* divide the drain-side selection gate line SGD, the word lines WL, and the source-side selection gate line SGS along the X-direction. Thus, it is possible to realize the connection relationship of disposing two drain-side selection gate lines SGD in the region directly above one word line WL.

Further, by providing the insulating plates 25*a* through 25*c*, the formation region of the silicon pillars 30 is provided. Thus, it is possible to arrange the memory cell transistors MC along the X-direction in each of the insulating plates 25. Further, by providing the insulating plates 25*a* through 25*c*, it is possible to support the stacked body 20 in the period from when the sacrificial films 41 (see FIG. 10) are removed to when the electrode films 13 (see FIG. 4) are formed.

Further, in the embodiment, the insulating plates 25 are intermittently formed along the X-direction. Thus, when replacing the sacrificial films 41 with the electrode films 13, the etching of the sacrificial films 41 and the deposition of the electrode films 13 proceed via the gaps between the insulating plates 25. As a result, it is possible to increase the arrangement density of the insulating plates 25 while maintaining the connection relationship described above. Thus, it is possible to increase the arrangement density of the memory cell transistors MC, and at the same time, increase the strength of the stacked body 20 when the sacrificial films 41 are removed.

Further, in the embodiment, the holes SH1 are formed in the same columns 26 as the insulating plates 25, and at the same time, the holes SH2 are formed between the columns 26. Therefore, it is possible to prevent the arrangement period of the memory cell transistors MC in the Y-direction from increasing due to the formation of the holes SH1 and SH2.

Further, in the embodiment, the contacts 29 are each connected to the bridge part 14*b* or the bridge part 14*c* of the electrode films 13. Thus, it is possible to ensure the margin of the forming positions of the contacts 29, and the formation of the contacts 29 becomes easy.

It should be noted that although in the embodiment, there is shown an example in which one column 26*b* is disposed between two columns 26*a*, and the word lines WL and the source-side selection gate line SGS are each divided into two parts, and the drain-side selection gate line SGD is divided into four parts, the invention is not limited to this configuration. Assuming n as an integer equal to or greater than 1, it is possible to dispose n columns 26*b* between the two columns 26*a*. In this case, between the two columns 26*a*, the word lines WL and the source-side selection gate line SGS are each divided into two parts, and the drain-side selection gate line SGD is divided into {(n+1)×2} parts. It is possible for the columns 26*c* to be disposed between the column 26*a* and the column 26*b* adjacent to each other, and between the columns 26*b* adjacent to each other, respectively. It should be noted that in the embodiment, the case in which n is 1 is described as an example.

According to the embodiment described hereinabove, it is possible to realize the semiconductor memory device high in integration degree.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first electrode film spreading along a first direction and a second direction crossing the first direction;
   a second electrode film provided on a third direction side with respect to a part except a first end part and a second end part in the first electrode film, the third direction crossing a plane including the first direction and the second direction, the first end part and the second end part being located on both sides in the first electrode film in the first direction;
   first insulating plates intermittently disposed along the first direction and each of two columns separated in the second direction from each other, and penetrating the first electrode film and the second electrode film in the third direction;
   second insulating plates provided between the two columns, intermittently disposed along the first direction and each of n columns (n is an integer not less than 1) separated in the second direction from each other, and penetrating the first electrode film and the second electrode film in the third direction;
   third insulating plates provided between one of the two columns and a column formed of the second insulating plates, intermittently disposed along the first direction, and penetrating the first electrode film and the second electrode film in the third direction;
   a first insulating member provided between one of the first insulating plates and one of the third insulating plates, being in contact with the one of the first insulating plates and the one of the third insulating plates, and penetrating the first electrode film and the second electrode film in the third direction;
   a second insulating member provided between the one of the second insulating plates and one of the third insulating plates, being in contact with the one of the second insulating plates and the one of the third insulating plates, and penetrating the first electrode film and the second electrode film in the third direction;
   a semiconductor member extending in the third direction; and
   a charge storage member provided between a part except the first end part and the second end part in the first electrode film and the semiconductor member,
   the first electrode film being divided into two parts isolated from each other by the second insulating plates, the third insulating plates, the first insulating member and the second insulating member between the two columns, and
   the second electrode film being divided into {(n+1)×2} parts isolated from each other by the second insulating plates, the third insulating plates, the first insulating member and the second insulating member between the two columns.

2. The device according to claim 1, further comprising:
   a third insulating member provided between the first insulating plates adjacent in the first direction to each other, and longer in length in the second direction than the first insulating plates;
   a fourth insulating member provided between the second insulating plates adjacent in the first direction to each other, and longer in length in the second direction than the second insulating plates; and
   a fifth insulating member provided between the third insulating plates adjacent in the first direction to each other, and longer in length in the second direction than the third insulating plates.

3. The device according to claim 1, further comprising:
   a first contact extending in the third direction, and connected to a part disposed between the second insulating plates adjacent in the first direction to each other in the first electrode film; and
   a second contact extending in the third direction, and connected to a part disposed between the third insulating plates adjacent in the first direction to each other in the second electrode film.

4. The device according to claim 1, further comprising:
   a third electrode film spreading along the first direction and the second direction,
   wherein the first electrode film is disposed between the third electrode film and the second electrode film, and
   the third electrode film is divided into two parts isolated from each other by the second insulating plates, the third insulating plates, the first insulating member and the second insulating member between the two columns.

5. The device according to claim 4, further comprising:
   a third contact extending in the third direction, and connected to a part disposed between the third insulating plates adjacent in the first direction to each other in the third electrode film.

6. The device according to claim 4, further comprising:
   a fourth electrode film spreading along the first direction and the second direction,
   wherein the third electrode film is disposed between the fourth electrode film and the first electrode film, and
   the fourth electrode film is divided into two parts isolated from each other by the second insulating plates, the third insulating plates, the first insulating member and the second insulating member between the two columns.

7. The device according to claim 6, further comprising:
   a fourth contact extending in the third direction, and connected to a part disposed between the second insulating plates adjacent in the first direction to each other in the fourth electrode film.

8. The device according to claim 1, wherein the n is 1.

9. The device according to claim 1, wherein the semiconductor members are respectively provided between the first insulating plates adjacent in the first direction to each other, between the second insulating plates adjacent in the first direction to each other, and between the third insulating plates adjacent in the first direction to each other.

10. A semiconductor memory device comprising:
    a first electrode film and a second electrode film isolated from each other;

a third electrode film and a fourth electrode film provided on a first direction side of the first electrode film, and isolated from each other;

a fifth electrode film and a sixth electrode film provided on a first direction side of the second electrode film, and isolated from each other;

a first semiconductor member, a second semiconductor member and a third semiconductor member each extending in the first direction; and a first charge storage member, a second charge storage member, a third charge storage member, a fourth charge storage member, a fifth charge storage member and a sixth charge storage member, the first electrode film including a first interconnection and a second interconnection extending in a second direction crossing the first direction, arranged along a third direction crossing a plane including the first direction and the second direction, and connected to each other, the second electrode film including a third interconnection and a fourth interconnection extending in the second direction, arranged along the third direction, and connected to each other, the third electrode film including a fifth interconnection disposed on the first direction side of the first interconnection, and extending in the second direction, the fourth electrode film including a sixth interconnection disposed on the first direction side of the second interconnection, and extending in the second direction, the fifth electrode film having a seventh interconnection disposed on the first direction side of the third interconnection, and extending in the second direction, the sixth electrode film having an eighth interconnection disposed on the first direction side of the fourth interconnection, and extending in the second direction, the third interconnection being disposed between the first interconnection and the second interconnection, the second interconnection being disposed between the third interconnection and the fourth interconnection, the first semiconductor member being disposed between the first interconnection and the third interconnection, and between the fifth interconnection and the seventh interconnection, the second semiconductor member being disposed between the second interconnection and the third interconnection, and between the sixth interconnection and the seventh interconnection, the third semiconductor member being disposed between the second interconnection and the fourth interconnection, and between the sixth interconnection and the eighth interconnection, the first charge storage member being disposed between the first interconnection and the first semiconductor member, the second charge storage member being disposed between the third interconnection and the first semiconductor member, the third charge storage member being disposed between the third interconnection and the second semiconductor member, the fourth charge storage member being disposed between the second interconnection and the second semiconductor member, the fifth charge storage member being disposed between the second interconnection and the third semiconductor member, and the sixth charge storage member being disposed between the fourth interconnection and the third semiconductor member.

* * * * *